United States Patent [19]
Masghati

[11] Patent Number: 5,841,620
[45] Date of Patent: *Nov. 24, 1998

[54] TRANSMISSION BANDWIDTH EXTENDER/ CATEGORY 5 PROTECTOR

[75] Inventor: Mohammad Masghati, Carol Stream, Ill.

[73] Assignee: Illinois Tool Works Inc., Glenview, Ill.

[ * ] Notice: The term of this patent shall not extend beyond the expiration date of Pat. No. 5,706,160.

[21] Appl. No.: 938,069

[22] Filed: Sep. 26, 1997

Related U.S. Application Data

[63] Continuation-in-part of Ser. No. 577,548, Dec. 22, 1995, Pat. No. 5,706,160.

[51] Int. Cl.⁶ ..................................................... H02H 9/06
[52] U.S. Cl. .............................. 361/119; 361/56; 361/111
[58] Field of Search .................................. 361/54, 56, 58, 361/91, 116, 118, 119, 127, 679, 748, 752; 379/412; 439/76.1, 676, 607

[56] References Cited

U.S. PATENT DOCUMENTS

| | | | |
|---|---|---|---|
| 5,269,708 | 12/1993 | De Young et al. | 439/676 |
| 5,299,956 | 4/1994 | Brownell et al. | 439/638 |
| 5,310,363 | 5/1994 | Brownell | 439/676 |
| 5,493,469 | 2/1996 | Lace et al. | 361/119 |
| 5,563,761 | 10/1996 | Apa et al. | 361/119 |

*Primary Examiner*—Ronald W. Leja

[57] ABSTRACT

A surge protector module for protecting telecommunications equipment from power and transient surges includes a two-piece interfitting housing, a printed circuit board, a plurality of circuit surge protector devices mounted on the printed circuit board, an input connector connected to a first side of the printed circuit board, and an output connector connected to a second side of the printed circuit board. The printed circuit board includes a unique pattern of conductive traces for use in association with the electrical components of the protector devices so as to meet the TIA's Category 5 specification for connectors. As a result, the bandwidth of the protector module has been extended. In one embodiment, the surge protector device is comprised of a first voltage suppressor, diode banks, and a second voltage suppressor.

18 Claims, 5 Drawing Sheets

TRANSMISSION BANDWIDTH EXTENDER/ CATEGORY 5 PROTECTOR

CROSS-REFERENCE TO RELATED APPLICATION

The present invention is a continuation-in-part application based on prior application Ser. No. 08/577,548 now U.S. Pat. No. 5,706,160 filed on Dec. 22, 1995, and entitled "Transmission Bandwidth Extender/Category 5 Protector."

BACKGROUND OF THE INVENTION

This invention relates generally to surge protection devices for protecting telephone communications related equipment from power and transient surges. More particularly, the present invention relates to an improved surge protector module for protecting telecommunication equipment from power and transient surges occurring on the tip and/or ring conductors of transmission lines connected thereto. Specifically, the surge protector module of the instant invention meets the maximum allowable transmission loss due to building internal connectors according to the most recent wiring specifications set forth by the Telecommunication Industry Association (TIA) for Category 5 (specification #568A).

As is known to those in the wiring industry, the Telecommunication Industry Association has written the following specification numbers: TIA 568A; TSB 40; and TSB 36 which govern the amount of maximum transmission loss as measured in decibels (dB) due to internal wiring and connectors must be equal to or less than in order to meet the various categories (i.e., Category 3, Category 4, and Category 5). The Category 5 is the most stringent and specifies the least amount of transmission losses over a frequency range between 1 to 100 MHz.

In the Table listed below, there are shown the maximum allowable transmission loss (ATTENUATION) and the minimum allowed near end crosstalk (NEXT) between adjacent wire pairs of connectors for the various categories:

|  | ATTENUATION | | | NEXT | | | RETURN LOSS | | |
|---|---|---|---|---|---|---|---|---|---|
| Freq (MHz) | Cat. 3 (dB) | Cat. 4 (dB) | Cat. 5 (dB) | Cat. 3 (dB) | Cat. 4 (dB) | Cat. 5 (dB) | Cat. 3 (dB) | Cat. 4 (dB) | Cat. 5 (dB) |
| 1 | 0.4 | 0.1 | 0.1 | 58 | >65 | >65 | NA | −23 | −23 |
| 4 | 0.4 | 0.1 | 0.1 | 46 | 58 | >65 | NA | −23 | −23 |
| 8 | 0.4 | 0.1 | 0.1 | 40 | 52 | 62 | NA | −23 | −23 |
| 10 | 0.4 | 0.1 | 0.1 | 38 | 50 | 60 | NA | −23 | −23 |
| 16 | 0.4 | 0.2 | 0.2 | 34 | 46 | 56 | NA | −23 | −23 |
| 20 |  | 0.2 | 0.2 |  | 44 | 54 |  | −14 | −14 |
| 25 |  |  | 0.2 |  |  | 52 |  |  | −14 |
| 31.25 |  |  | 0.2 |  |  | 50 |  |  | −14 |
| 62.5 |  |  | 0.3 |  |  | 44 |  |  | −14 |
| 100 |  |  | 0.4 |  |  | 40 |  |  | −14 |

While the above specifications, written by TIA, do not include surge protectors at the present time, the inventors have developed an improved surge protector module for protecting telecommunications equipment from power and transient surges which does meet the current TIA specification. The present invention is directed to the structure of a surge protector module having a plurality (4) of circuit surge protector devices mounted on a printed circuit board in conjunction with a method of constructing the printed circuit board so as to meet the TIA specification for Category 5. The surge protector module includes a two-piece interfitting housing which receives the printed circuit board for mounting the four sets of circuit surge protector devices, a pair of AT&T Style 110 terminal connectors connected to an exposed side, and a modular jack connected to a protected side for protecting telephone communications related equipment and the like against power and transient surges. Other types of connector means for either the exposed or protected side include RJ-45/RJ-11 jack and any punched-down terminals such as 110, 66, Krone-type, or BIX connectors.

The foregoing applies specifically to the disclosure of the parent application Ser. No. 08/577,548. A second embodiment of a circuit surge protector device of the present invention added by way of this continuation-in-part application is quite similar to the schematic circuit diagram of FIG. 4, except that the protector device therein has been modified so as to include two series-connected gas tubes joined between the tip and ring terminals on the unprotected side and in parallel with the four diodes banks and the two voltage suppressors. As a result, this second added embodiment represents an improvement over the embodiment of FIG. 4 since it has the capability of handling higher surge energy. Further, a third embodiment of a circuit surge protector device of the present invention also added by way of this continuation-in-part application includes only the two series-connected gas tubes of the second embodiment.

SUMMARY OF THE INVENTION

Accordingly, it is a general object of the present invention to provide an improved surge protector module for protecting telephone communications related equipment from power and transient surges which is relatively simple and economical to manufacture and assemble.

It is an object of the present invention to provide a surge protector module which has an extended bandwidth and meets the TIA specification for Category 5.

It is another object of the present invention to provide a method for fabricating a surge protector module which employs a unique construction of a printed circuit board for mounting circuit surge protector devices thereon in order to meet the TIA specification for Category 5.

It is still another object of the present invention to provide a surge protector module having a two-piece interfitting housing which receives a printed circuit board for mounting a plurality of circuit surge protector devices, an input connector means connected to an exposed side, and an output connector means connected to a protected side for protecting telephone communications related equipment and the like against power and transient surges.

It is still yet another object of the present invention to provide a surge protector module which is characterised by a design which has small series impedance and a large line-to-line impedance.

In a preferred embodiment of the present invention, there is provided a surge protector module for protecting telecommunications equipment and the like from power and transient surges which includes a housing for receiving and enclosing a printed circuit board. The printed circuit board is disposed within the housing for mounting a plurality of circuit surge protector devices.

The printed circuit board includes a tip conductive trace formed on a top side thereof and a ring conductive trace formed on a bottom side thereof. The circuit surge protector devices include voltage suppressor means and diode means. The voltage suppressor means is operatively connected to the tip and ring conductive traces. The diode means is interconnected between the tip conductive trace and the ring conductive trace and in series with the voltage suppressor means for reducing the capacitance therebetween caused by the voltage suppressor means.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
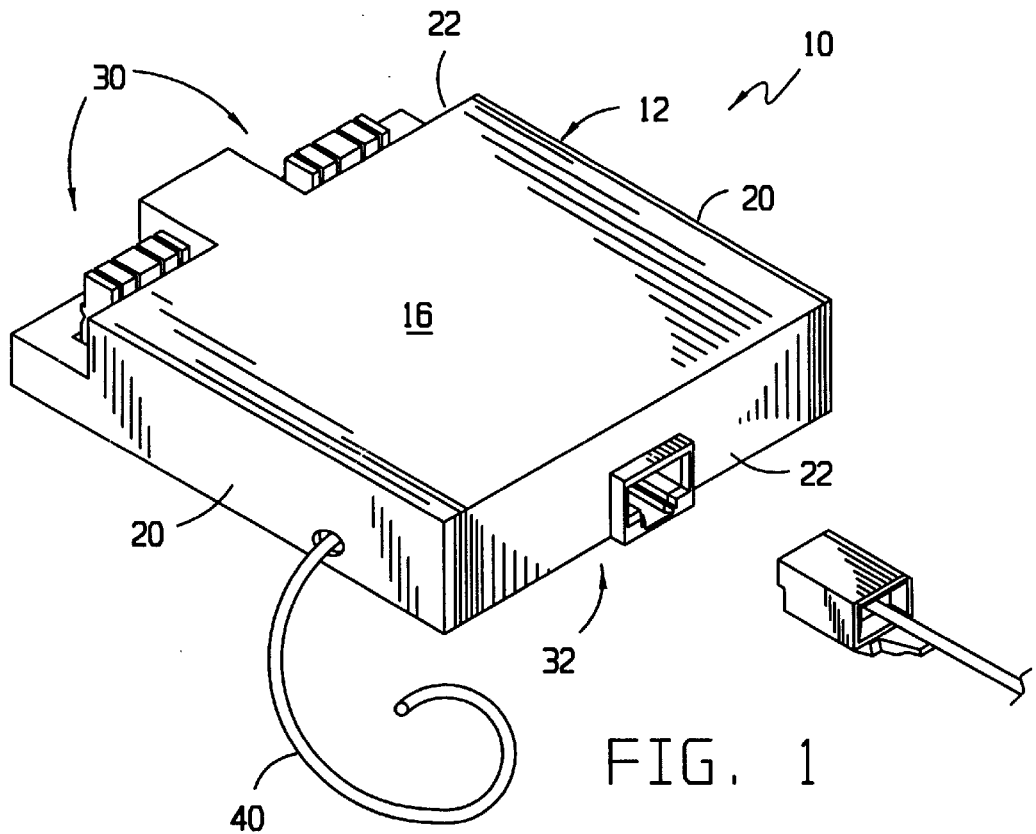
FIG. 1 is a perspective view of a surge protector module, constructed in accordance with the principles of the present invention.

It is to be distinctly understood at the outset that the present invention shown in the drawings and described in detail in conjunction with the preferred embodiments is not intended to serve as a limitation upon the scope or teachings thereof, but is to be considered merely an exemplification of the principles of the present invention.

Figure 2:
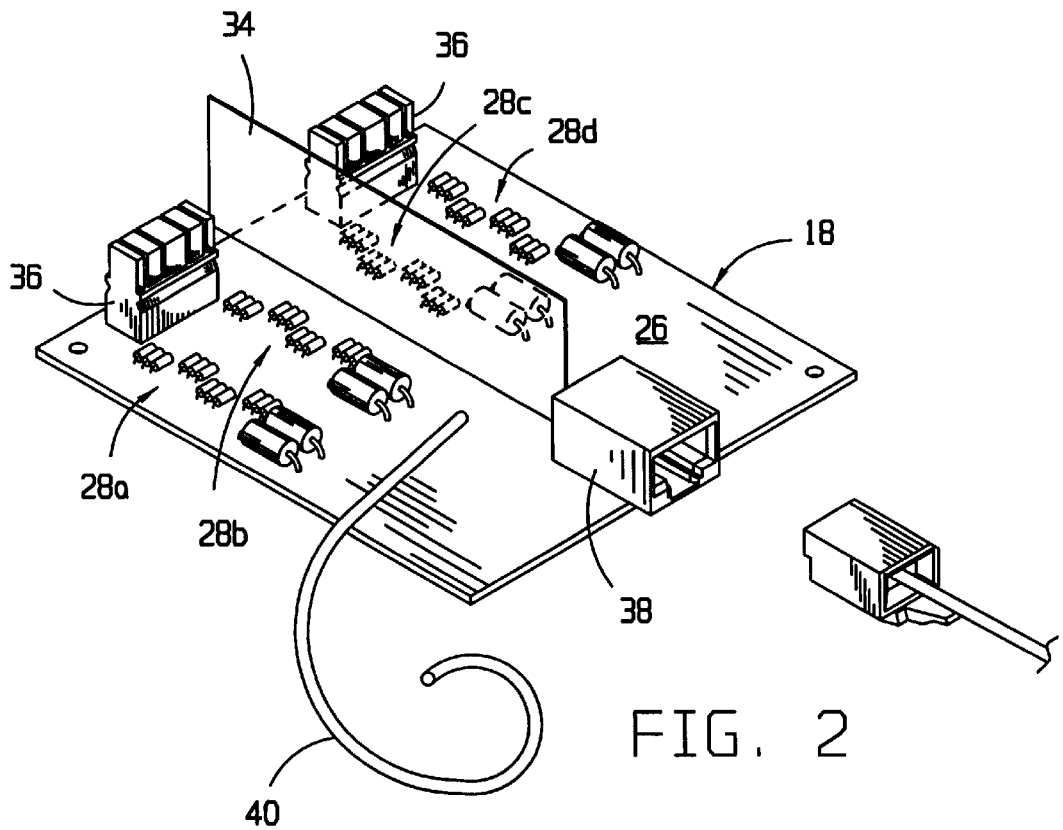
FIG. 2 is a view similar to FIG. 1, but with the housing cover and base removed.
Figure 3:
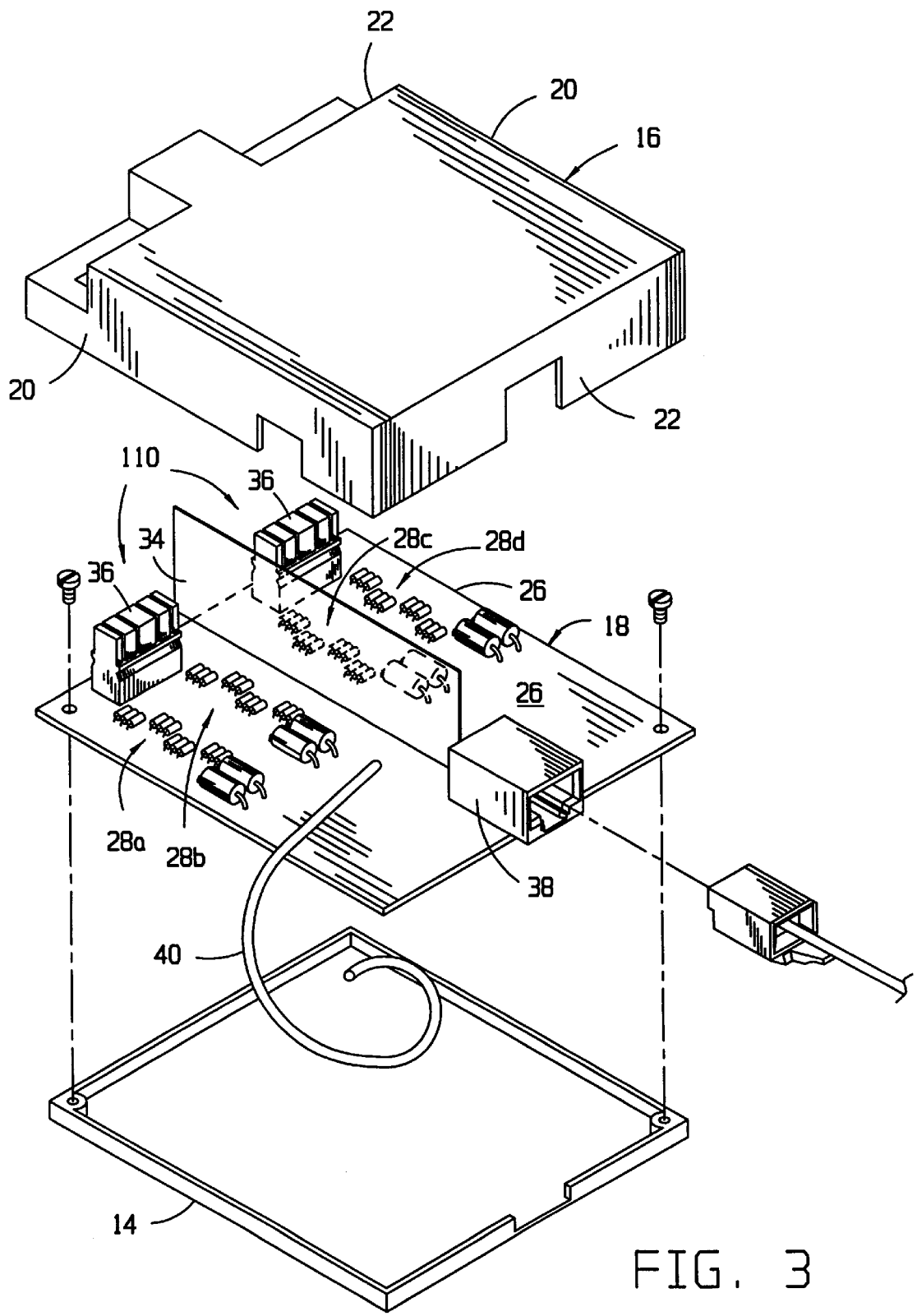
FIG. 3 is an exploded perspective view of the surge protector module of FIG. 1.

Referring now in detail to the various views of the drawings and in particular to FIGS. 1–3, there is illustrated a surge protector module of the present invention which is designated generally by reference numeral 10 for protecting telecommunications equipment from power and transient surges occurring on tip and/or ring conductors of transmission lines connected thereto. The surge protector module 10 is utilized to protect sensitive communications equipment up to 4-pair of wires (8 conductors) from transient power impulses for each pair of wires. The surge protector module has been uniquely designed so as to meet the maximum allowable transmission loss due to internal wiring of a building and connectors according to TIA specification for Category 5 (specification #568A for connectors).

The surge protector module 10 has a substantially boxlike configuration, although other-shaped constructions can be likewise utilized. The surge protector module includes a molded housing 12 made of a suitable plastic material, such as non-polycarbonate and the like which is comprised of a co-mating base member 14 and a cover member 16. The cover member 16 can be suitably secured to the base member 14 in any number of conventional means known in the art.

The base member 14 has a generally rectangular configuration and has a flat surface which is adapted to mount a printed circuit board sub-assembly 18. The cover member 16 is provided with opposed side walls 20 and opposed end walls 22, respectively. The side and end walls 20 and 22 define a cavity 24 for receiving and enclosing the printed circuit board sub-assembly 18 mounted on the base member 14.

The printed circuit board sub-assembly 18 includes a printed circuit board 26, a plurality (4) of circuit surge protector devices 28a–28d, an input connector means 30, an output connector means 32, and a ground shield 34. The input conductor means 30 is preferably disposed adjacent the top end of the printed circuit board 26, and the output connector means 32 is preferably disposed adjacent the bottom end of the printed circuit board 26.

The input connector means can be any number of commercially available connectors well known in the art. For example, for telecommunication equipment the input connector means is comprised preferably of a pair of AT&T 110 terminal connectors 36 each having a 4-position so that they can together accommodate up to 4-pairs of incoming telephone lines of a telephone trunk cable (not shown) from either a central office outside the service area or from a distribution panel within the building.

Similarly, the output connector means can be a number of different types and is preferably a standardized modular jack 38 referred to as an 8-position RJ45 jack for terminating 4 wire-pair telephone line cord. The modular jack 38 is adapted to receive a standardized modular plug connectible to individual telephone equipment. The input and output connector means provide for quick and easy mechanical connections to the four sets of circuit surge protector devices 28a–28d located on the printed circuit board 26.

In order to facilitate the functioning of the circuit surge protector devices 28a–28d disposed on the printed circuit board 26 as well as to provide a discharge path to earth ground for the power and transient surges, a ground wire 40 has its one end operatively connected to the protector devices and its other end connectible to an external common grounded bus (not shown). The ground wire 40 is preferably disposed so as to extend through one of the side walls 20 of the housing 12.

Figure 4:
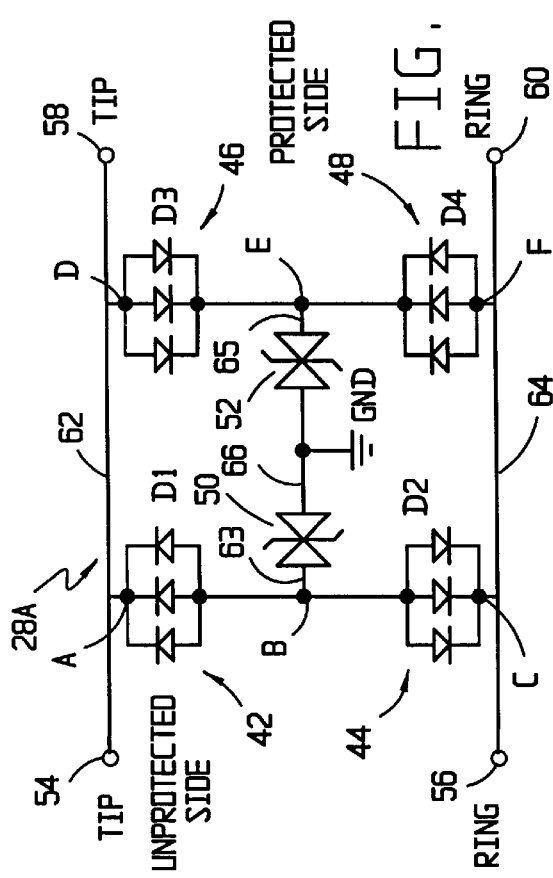
FIG. 4 is a detailed schematic circuit diagram of one of the circuit surge protector devices of the present invention.

The present invention relates to the structure of the surge protector module 10 containing the four (4) sets of circuit surge protector devices 28a–28d mounted on the printed circuit board 26 in conjunction with the method of fabricating the plurality of conductive traces on the printed circuit board in order to meet the TIA specification for Category 5. A detailed schematic circuit diagram of one set of the circuit surge protector devices 28a–28d is illustrated in FIG. 4 of the drawings. Since each set of the protector devices is identical in its construction, it is believed sufficient to describe in detail only one of them.

As can be seen from FIG. 4, the circuit surge protector device 28a is comprised of four banks 42, 44, 46 and 48 of rectifier diodes and a pair of voltage suppressors 50, 52. The input side of the protector device 28a is connectible between two wires of incoming telephone transmission lines applied across an input tip terminal 54 and an input ring terminal 56 defining an unprotected side. The output side of the protector device 28a is connectible between two wires of individual telephone equipment to be protected applied across an output tip terminal 58 and an output ring terminal 60 defining a protected side.

Each of the four banks 42–48 of diodes is comprised of three (3) low capacitance diodes connected in parallel. The first bank 42 is formed of three diodes D1 connected in parallel with their common cathodes connected together at node A and further joined to a first conductor lead. The first conductor lead in the present invention takes the physical form of a tip or first conductive trace 62. The common anodes of the diodes D1 are also connected together B and further joined to a second conductor lead. The second conductor lead takes the physical form of a second conductive trace 63. The second bank 44 is formed of three diodes D2 connected in parallel with their common cathodes connected together at node C and further joined to a third conductor lead. In the present invention, the third conductor lead takes the physical form of a third or ring conductive trace 64. The common anodes of the diodes D2 are also connected together at the node B and to the second conductive trace 63.

Similarly, the third bank 46 is formed of three diodes D3 connected in parallel with their common anodes connected together at node D and further joined to the first conductive trace 62. The common cathodes of the diodes D3 are also connected together at node E and further joined to a fourth conductor lead. The fourth conductor lead takes the physical form of a fourth conductive trace 65. The fourth bank 48 is formed of three diodes D4 connected in parallel with their common anodes connected together at node F and further joined to the third conductive trace 64. The common cathodes of the diodes D4 are also connected together at the node E and to the fourth conductive trace 65. Each of the diodes D1–D4 in the respective banks 42–48 can be similar to the types 1N5408 or CSS02003 which have a low capacitance.

The first voltage suppressor 50 has its one end connected to the second conductive trace 63 and its other end connected to a ground source GND via a ground conductor lead. In the present invention, the ground conductor lead takes the physical form of enlarged common-ground conductive area 66. Similarly, the second voltage suppressor 52 has its one end connected to the fourth conductive trace 65 and its other end connected also to the enlarged common-ground conductive area 66. Each of the voltage suppressors 50 and 52 may be formed of a silicon avalanche suppressor (SAS), sidactor, gas tube, or Zener diode. In the preferred embodiment, the voltage suppressors 50, 52 are silicon avalanche suppressors similar to type 1.5KE.

Figure 5:
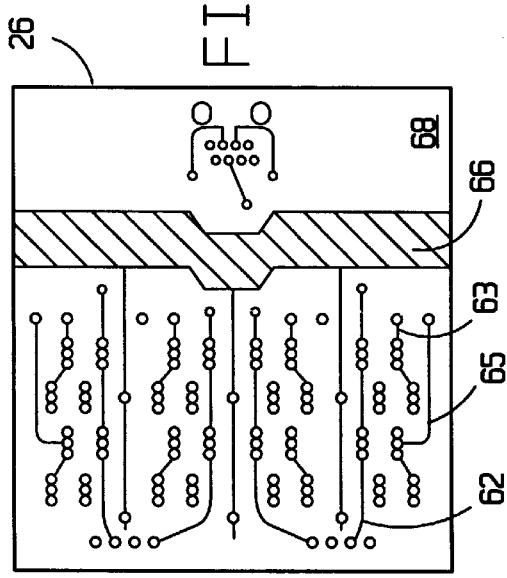
FIG. 5 is a top plan view of the printed circuit board with the electrical components removed, illustrating the layout of certain ones of the conductive traces.
Figure 7:
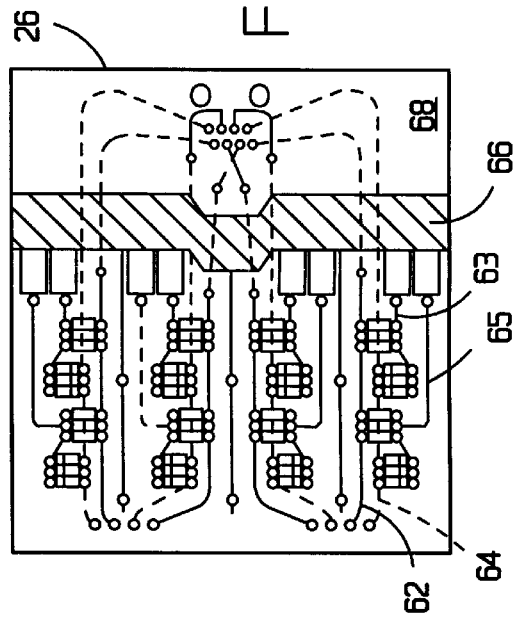
FIG. 7 is a top plan view of the printed circuit board, illustrating the combined layout of the conductor traces of FIGS. 5 and 6.
Figure 6:
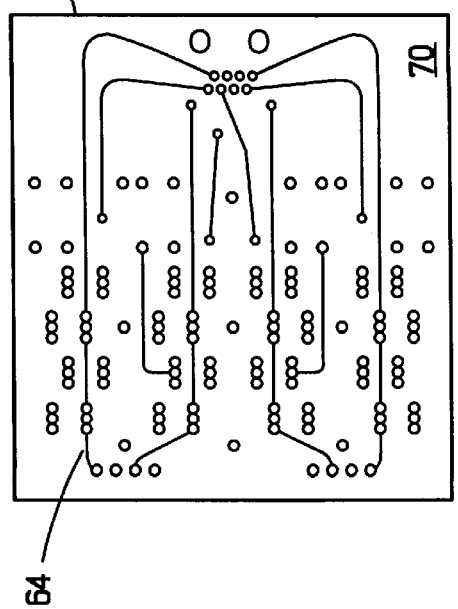
FIG. 6 is a bottom plan view of the printed circuit board, illustrating the layout of certain other ones of the conductive traces.

The fabrication technique for the conductive traces 62–65 on the printed circuit board for mounting the surge protector device 28a is best understood by reference to FIGS. 5–7 of the drawings. In order to meet the TIA specification for category 5, the inventors have determined that the loop (series) impedance of the surge protector device must be made to be as small as possible so as to extend the bandwidth of the transmission line connected thereto and to minimize the attenuation. In other words, the series resistance and inductive reactance in the tip or first conductive trace 62 and in the ring or third conductive trace 64 must be made very small. It has been found that this can be achieved by increasing the width of the conductive traces 62 and 64, by maintaining the length of these traces to be as short as possible, and by maintaining the conductive traces to be relatively straight.

Further, it has been determined by the inventors that the line-to-line (parallel) impedance must be made as large as possible in order to likewise extends the bandwidth of the transmission lines connected thereto. In other words, the line-to-line capacitance between the tip conductive trace 62 and the ring conductive trace 64 must be made to be very small. This can be accomplished by adding low capacitance diodes (i.e., D1, D4) in series with the capacitance due to the voltage suppressors 50, 52. While each bank of diodes is shown to contain three diodes, they may have any number of diodes dependent upon the amount of capacitance to be added as well as the amount of surge current to be experienced.

As can best be seen from FIGS. 5–7, the tip conductive trace 62 has been located on the top side 68 of the printed circuit board 26 and that the ring conductive trace 64 has been located on the bottom side 70 of the printed circuit board. The conductive traces 62 and 64 are preferably positioned to be as close as possible to each other, but not so they overlap each other. If the distance between the traces 62 and 64 is too far apart, there will be produced an excessive amount of inductive reactance. If the conductive traces 62 and 64 tend to overlap each other, there will be produced an excessive amount of capacitive reactance. In each instance, the bandwidth of the protector will be lowered.

It should be apparent to those skilled in the art that the criteria set forth above with respect to the conductive traces 62 and 64 for the first set of surge protector devices 28a applies equally as well to the corresponding traces for the second, third and fourth surge protector devices 28b–28d. Accordingly, the pattern of conductive traces 62 and 64 for each set of the surge protector devices is formed on the printed circuit board 26 as illustrated in FIGS. 5–7 so as to cooperate with the electrical components mounted thereon in order to meet the TIA specification for Category 5.

In addition, it has been determined by the inventors that in order to meet the crosstalk criteria (NEXT) for Category 5 the pair-to-pair impedance must be increased. In other words, the capacitance between the adjacent pairs of conductive traces 62, 64 for each set of surge protector devices must be decreased to a small value. This was found to be accomplished by increasing the distance between adjacent pairs. Further, by providing the ground shield 34 between the second and third pairs of conductive traces, this was found to improve the crosstalk therebetween.

Figure 8:
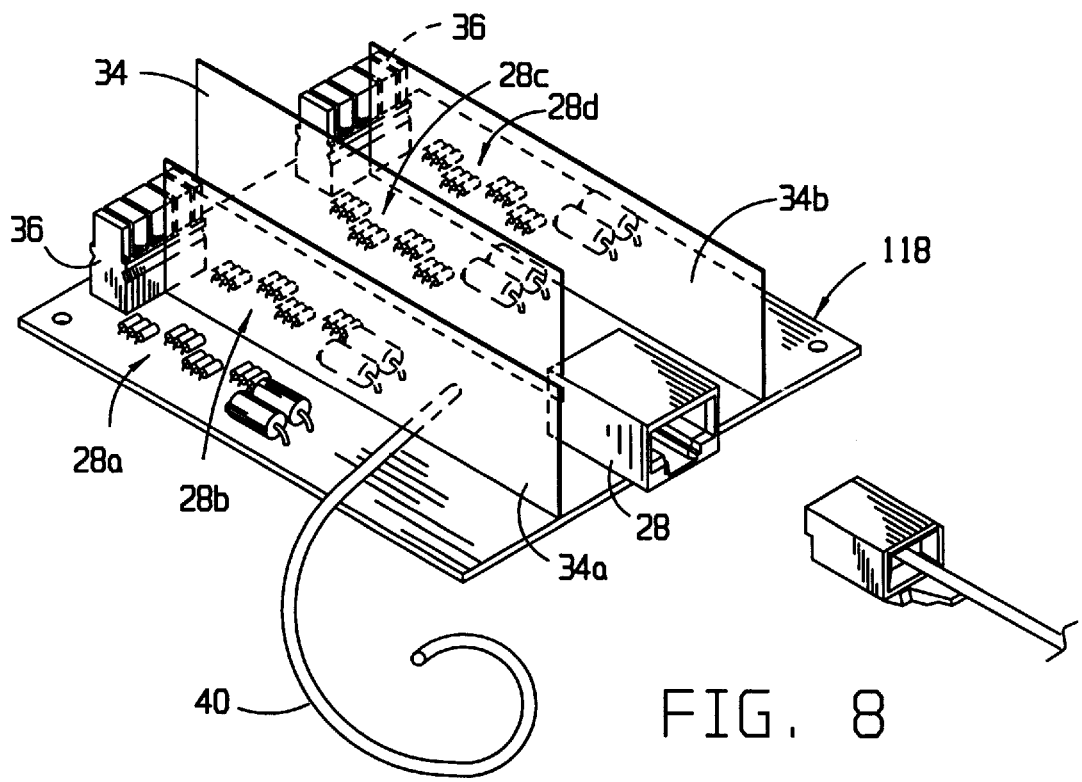
FIG. 8 is a view similar to FIG. 2, illustrating a second embodiment of the present invention.

In FIG. 8, there is shown a second alternate embodiment for the printed circuit board sub-assembly. It can be seen that the printed circuit board sub-assembly 118 is substantially identical to the printed circuit board sub-assembly 18 of FIG. 2, except that there are two additional ground shields provided. A second ground shield 34a is disposed between the first and second adjacent pair of conductive traces. A third ground shield 34b is disposed between the third and fourth pair of conductive traces.

Figure 9:
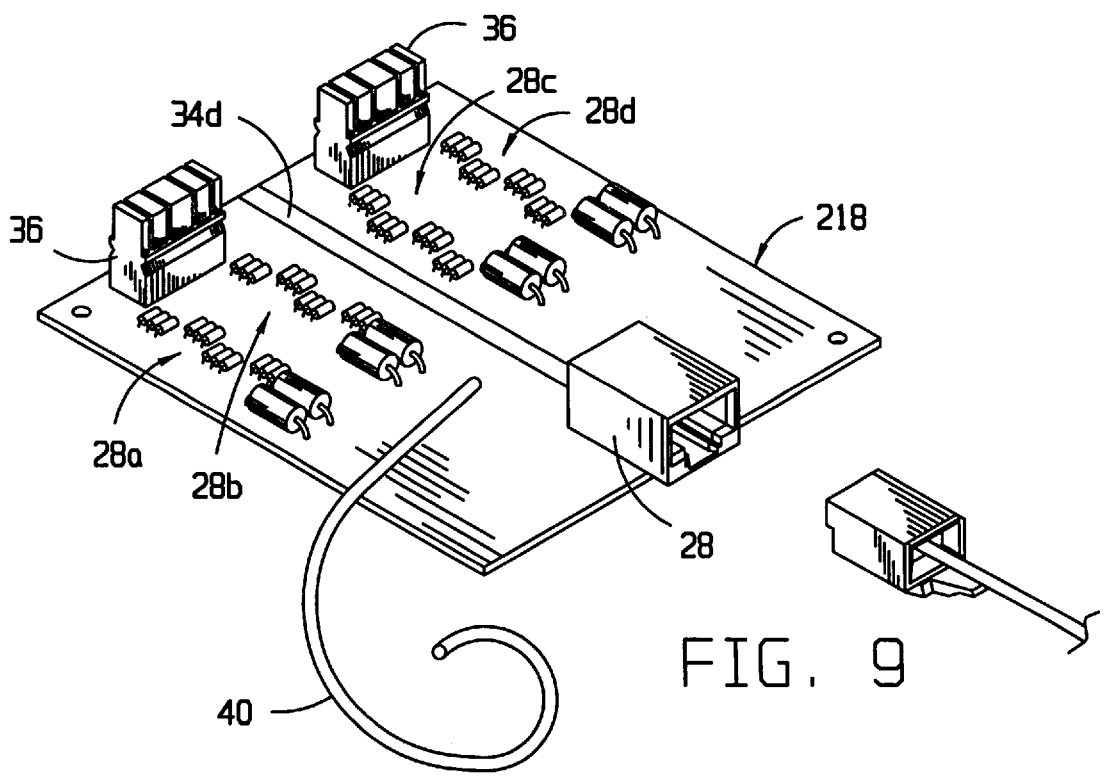
FIG. 9 is a view similar to FIG. 2, illustrating a third embodiment of the present invention.

In FIG. 9, there is shown a third alternate embodiment for the printed circuit board sub-assembly. It can be seen that the printed circuit board sub-assembly 218 is substantially identical again to the printed circuit board sub-assembly 18 of FIG. 2, except that the ground shield 34 has been replaced by an elongated slot 34d defining an air gap introduced between the second and third adjacent pairs of conductive traces. Since air has a lower dielectric constant than the material used to form the printed circuit board, the dielectric constant between the second and third pairs of conductive traces will be decreased and thus the capacitance will also be decreased, thereby improving the crosstalk therebetween.

From the foregoing detailed description, it can thus be seen that the present invention provides a surge protector module for protecting telecommunication equipment and the like from power surges which includes a two-piece interfitting housing which receives a printed circuit board for mounting four sets of circuit surge protector devices, an input connector means connected to an exposed side and an output connector connected to a protected side. The surge protector module is characterised by a small series impedance and a large line-to-line impedance. The printed circuit board has a unique pattern of conductive traces for mounting the electrical components of the protector devices so as to meet the TIA specification for Category 5.

Figure 10:
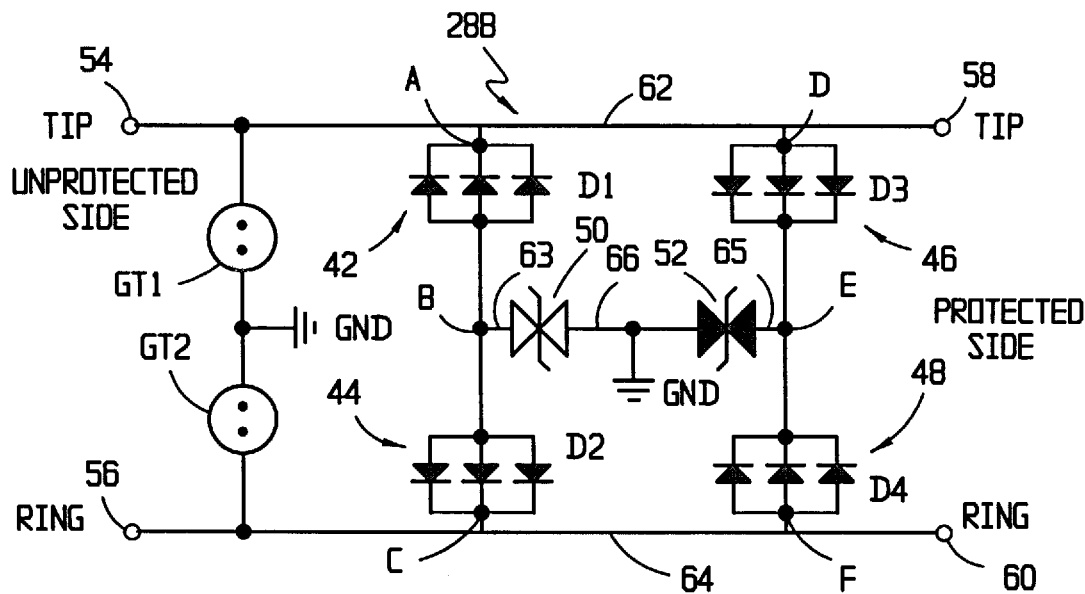
FIG. 10 is a detailed schematic circuit diagram of a second embodiment of a circuit surge protector device of the present invention.

In FIG. 10, there is illustrated a second embodiment of a circuit surge protector device 28b defining a hybrid circuit of the present invention. All of the circuit elements in the second embodiment of FIG. 10 are identical to the ones used in the protector device of FIG. 4 with the additon of a second voltage suppressor consisting of two series-connected gas tubes GT1 and GT2. In particular, the two series-connected gas tubes GT1 and GT2 are also connected between the incoming telephone transmission lines applied across the input tip terminal 54 and the input ring terminal 56. Further, the gas tubes are connected in parallel with the four banks 42–48 of the rectifier diodes D1–D4 and the pair of voltage suppressors 50,52. The junction of the gas tubes are joined to a ground potential GND.

In operation, upon the occurrence of a power and transient surge across the tip and ring terminals 54 and 56 the first voltage supressors 50,52 will initially clamp the surge to ground within a few nanoseconds. Then, the second voltage supressors formed of the gas tubes GT1,GT2 will subsequently fire and divert the balance of the surge to ground. As a result, when the protector device 28b is used in conjunction with the fabrication technique for the conductive traces 62–65 on the printed circuit board 26 it will meet the TIA 568A specification for Category 5 and will produce a very fast response time of a few nanoseconds along with the capability of handling higher energy surges.

Figure 11:
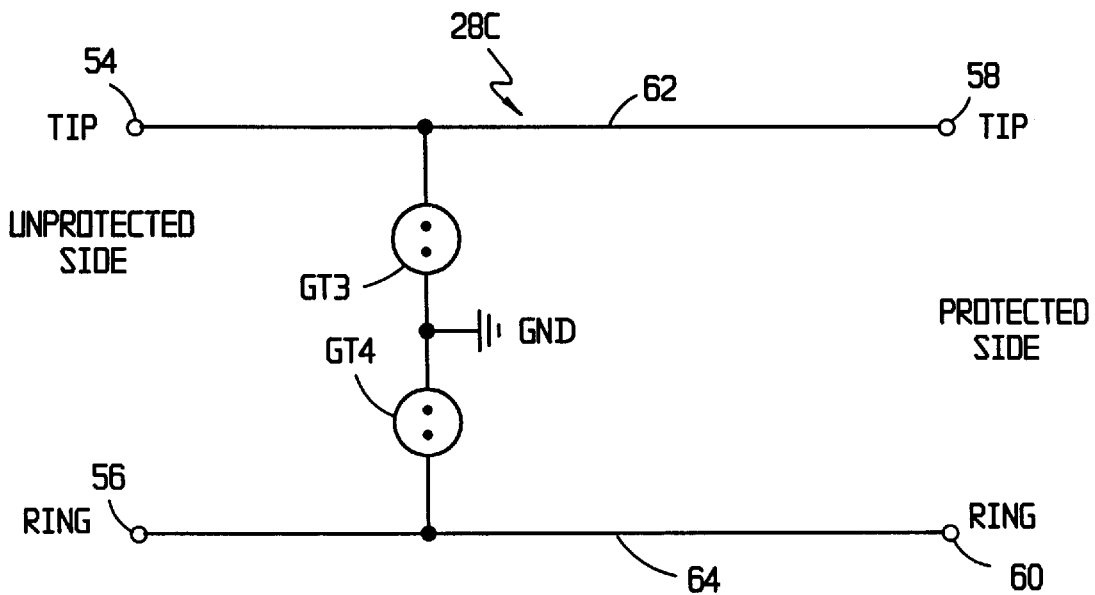
FIG. 11 is a detailed schematic circuit diagram of a third embodiment of a circuit surge protector device of the present invention.

In FIG. 11, there is illustrated a third embodiment of a circuit surge protector 28c defining a Category 5 gas tube protector. The surge protector 28c consists of two series-connected gas tubes GT3 and GT4. One end of the gas tubes is connected to both the input tip terminal 54 and the output tip terminal 58. The other end of the gas tubes is connected to both the input ring terminal 56 and the output ring terminal 60. The junction of the gas tubes is connected to the ground potential GND. Since the capacitance of the gas tubes are relatively low in the range of 1–2 nanofarads, there has been eliminated the need of the diode banks 42–48 in order to further the capacitance. As a consequence, when the protector device 28c is used in conjunction with the fabrication technique for the conductive traces 62,64 on the printed circuit board 26 it will still meet the TIA 568A specification for Category 5, but will produce a slower response time (e.g. a few microseconds) than the first voltage suppressors 50,52.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A surge protector module for protecting telephone communications equipment and the like from power and transient surges, comprising:

housing means for receiving and enclosing a printed circuit board;

circuit surge protector means;

said printed circuit board being disposed within said housing for mounting said circuit surge protector means;

said printed circuit board including a first tip conductive trace formed on a top side thereof and a first ring conductive trace formed on a bottom side thereof defining a first pair of tip and ring conductive traces;

said circuit surge protector means including first voltage suppressor means coupled to said first tip and ring conductive traces;

said circuit surge protector means further including diode means interconnected between said first tip conductive trace and said first ring conductive trace and in series with said voltage suppressor means for reducing the capacitance with respect to ground caused by said voltage suppressor means;

said circuit surge protector means further including second voltage suppressor means coupled to said first tip and ring conductive traces;

said printed circuit board further including a second tip conductive trace formed on the top side thereof and a second ring conductive trace formed on the bottom side thereof defining a second pair of tip and ring conductive traces;

said first tip conductive trace being positioned close to said corresponding first ring conductive trace, but not so that they overlap each other;

said first and second pairs of tip and ring conductive traces being formed of a relatively wide width, a relatively short length, and made relatively straight so as to reduce the series resistance and inductive reactance for extending the bandwidth of said protector module; and a ground shield disposed between said first and second pairs of tip and ring conductives so as to improve crosstalk therebetween.

2. A surge protector module as claimed in claim 1, wherein the distance between said first and second pairs of tip and ring conductive traces are increased so as to improve crosstalk therebetween.

3. A surge protector module as claimed in claim 1, further comprising air gap means disposed between said first and second pairs of tip and ring conductive traces so as to improve crosstalk therebetween.

4. A surge protector module as claimed in claim 3, wherein said air gap means includes an elongated slot.

5. A surge protector module as claimed in claim 1, wherein said first voltage suppressor means comprises first and second silicon avalanche suppressors.

6. A surge protector module as claimed in claim 5, wherein said second voltage suppressor means comprises first and second gas tubes.

7. A surge protector module as claimed in claim 1, wherein said diode means is comprised of four banks of diodes.

8. A surge protector module as claimed in claim 7, wherein each bank of diodes includes three diodes connected in parallel whose anodes are connected to a first node and whose cathodes are connected to a second node.

9. A surge protector module as claimed in claim 8, wherein said first node of each bank of diodes is coupled to one of said first tip and ring conductive traces and said second node is coupled to said first voltage suppressor means.

10. A surge protector module as claimed in claim 9, wherein each of said diodes has a low capacitance.

11. A surge protector module as claimed in claim 1, further comprising input connector means operatively connected to a first end of said printed circuit board for supplying 4-pair of wires thereto.

12. A surge protector module as claimed in claim 11, wherein said input connector means is comprised of a pair of multi-position terminal connectors.

13. A surge protector module as claimed in claim 12, further comprising output connector means operatively connected to a second end of said printed circuit board for receiving said 4-pair of wires therefrom.

14. A surge protector module as claimed in claim 13, wherein said output connector means is comprised of an 8-position RJ-45 jack.

15. A surge protector module for protecting telephone communications equipment and the like from power and transient surges, comprising:

housing means for receiving and enclosing a printed circuit board;

circuit surge protector means;

said printed circuit board being disposed within said housing for mounting said circuit surge protector means;

said printed circuit board including a tip conductive trace formed on a top side thereof and a ring conductive trace formed on a bottom side thereof;

said circuit surge protector means including first voltage suppressor means coupled to said tip and ring conductive traces;

said circuit surge protector means further including second voltage suppressor means coupled to said tip and ring conductive traces;

said circuit surge protector means further including diode means interconnected between said tip conductive trace and said ring conductive trace and in series with said voltage suppressor means for reducing the capacitance with respect to ground caused by said voltage suppressor means; and said diode means being formed of four banks of diodes.

16. A surge protector module as claimed in claim 15, wherein each bank of diodes includes three diodes connected in parallel whose anodes are connected to a first node and whose cathodes are connected to a second node.

17. A surge protector module as claimed in claim 16, wherein said first node of each bank of diodes is coupled to one of said tip and ring conductive traces and said second node is coupled to said first voltage suppressor means.

18. A surge protector module as claimed in claim 17, wherein each of said diodes has a low capacitance.

* * * * *